(12) United States Patent
Masuhara et al.

(10) Patent No.: US 10,637,345 B2
(45) Date of Patent: Apr. 28, 2020

(54) SEMICONDUCTOR DEVICE AND POWER CONVERSION DEVICE

(71) Applicant: Mitsubishi Electric Corporation, Chiyoda-ku (JP)

(72) Inventors: Takashi Masuhara, Chiyoda-ku (JP); Takeshi Horiguchi, Chiyoda-ku (JP); Mamoru Kamikura, Chiyoda-ku (JP); Kodai Katagiri, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/307,004

(22) PCT Filed: Jun. 23, 2017

(86) PCT No.: PCT/JP2017/023122
§ 371 (c)(1),
(2) Date: Dec. 4, 2018

(87) PCT Pub. No.: WO2018/008424
PCT Pub. Date: Jan. 11, 2018

(65) Prior Publication Data
US 2020/0052573 A1  Feb. 13, 2020

(30) Foreign Application Priority Data
Jul. 8, 2016 (JP) ................. 2016-135954

(51) Int. Cl.
*H02M 1/08* (2006.01)
*H01L 23/40* (2006.01)
*H01L 23/522* (2006.01)

(52) U.S. Cl.
CPC ............. *H02M 1/08* (2013.01); *H01L 23/40* (2013.01); *H01L 23/5222* (2013.01); *H01L 23/5227* (2013.01)

(58) Field of Classification Search
CPC ............ H02M 1/08; H02M 1/44; H02M 1/12; H02M 5/458; H02M 7/003; H02M 7/48;
(Continued)

(56) References Cited

U.S. PATENT DOCUMENTS 6,327,165 B1 * 12/2001 Yamane ................ H02M 7/003
363/132
7,719,838 B2 * 5/2010 Nakajima ............. H02M 7/003
361/699
(Continued)

FOREIGN PATENT DOCUMENTS

| JP | 2015-106601 A | 6/2015 |
| JP | 2015-122342 A | 7/2015 |
| JP | 2015-149883 A | 8/2015 |

OTHER PUBLICATIONS

International Search Report dated Aug. 15, 2017 in PCT/JP2017/023122 filed Jun. 23, 2017.

*Primary Examiner* — Yusef A Ahmed
(74) *Attorney, Agent, or Firm* — Oblon, McClelland, Maier & Neustadt, L.L.P.

(57) ABSTRACT

A semiconductor device includes a positive electrode-side semiconductor element, a negative electrode-side semiconductor element, a positive electrode plate, a negative electrode plate, an AC electrode plate, a positive electrode-side auxiliary electrode terminal, a negative electrode-side auxiliary electrode terminal, a positive electrode-side capacitor, and a negative electrode-side capacitor. The positive electrode plate is connected to a first positive electrode of the positive electrode-side semiconductor element. The negative electrode plate is connected to a second negative electrode of the negative electrode-side semiconductor element. The AC electrode plate is connected to a first negative electrode of the positive electrode-side semiconductor element and a second positive electrode of the negative electrode-side
(Continued)

semiconductor element. The positive electrode-side capacitor is connected to the positive electrode plate and the positive electrode-side auxiliary electrode terminal. The negative electrode-side capacitor is connected to the negative electrode plate and the negative electrode-side auxiliary electrode terminal.

9 Claims, 8 Drawing Sheets

(58) Field of Classification Search
CPC ...... H05K 1/0218; H01L 23/40; H02K 11/33; H02K 3/50
See application file for complete search history.

(56) References Cited

U.S. PATENT DOCUMENTS

| | | | | |
|---|---|---|---|---|
| 9,148,946 | B1* | 9/2015 | Singh | H05K 1/021 |
| 9,646,927 | B2* | 5/2017 | Kamikura | H01L 25/072 |
| 9,717,167 | B2* | 7/2017 | Nishikimi | H02M 7/003 |
| 2006/0086981 | A1* | 4/2006 | Yamaguchi | H02M 7/003 |
| | | | | 257/347 |
| 2011/0051371 | A1* | 3/2011 | Azuma | B60K 6/445 |
| | | | | 361/699 |
| 2011/0149625 | A1* | 6/2011 | Azuma | B60K 6/28 |
| | | | | 363/141 |
| 2013/0016548 | A1* | 1/2013 | Seki | H01L 24/32 |
| | | | | 363/131 |
| 2013/0194853 | A1* | 8/2013 | Tokuyama | H01L 23/36 |
| | | | | 363/131 |
| 2014/0119087 | A1* | 5/2014 | Matsuoka | H02M 7/003 |
| | | | | 363/132 |
| 2014/0126154 | A1* | 5/2014 | Higuchi | B60L 15/20 |
| | | | | 361/714 |
| 2015/0023081 | A1* | 1/2015 | Obiraki | H02M 7/003 |
| | | | | 363/131 |
| 2015/0189784 | A1* | 7/2015 | Hirano | H05K 7/1432 |
| | | | | 361/728 |
| 2015/0195957 | A1* | 7/2015 | Ohoka | H05K 7/20927 |
| | | | | 361/702 |
| 2015/0216089 | A1* | 7/2015 | Tanaka | H05K 7/209 |
| | | | | 361/699 |
| 2016/0149512 | A1* | 5/2016 | Nakatsu | H02M 7/003 |
| | | | | 361/707 |
| 2017/0154834 | A1* | 6/2017 | Tonedachi | H01L 24/40 |
| 2018/0007785 | A1* | 1/2018 | Kamikura | H02M 5/458 |
| 2018/0041136 | A1* | 2/2018 | Tokuyama | H01L 23/473 |
| 2018/0278172 | A1* | 9/2018 | Tokuyama | H01L 23/49541 |
| 2019/0252954 | A1* | 8/2019 | Nishihata | H02K 11/33 |
| 2019/0333843 | A1* | 10/2019 | Hiramitsu | H01L 23/36 |
| 2019/0333909 | A1* | 10/2019 | Sugita | H01L 23/49562 |
| 2020/0007026 | A1* | 1/2020 | Nishizawa | H02M 7/537 |

* cited by examiner

SEMICONDUCTOR DEVICE AND POWER CONVERSION DEVICE

TECHNICAL FIELD

The present invention relates to a semiconductor device and a power conversion device.

BACKGROUND ART

As an example of a semiconductor device, a semiconductor power module including a semiconductor element for controlling electric power is known. It is known that, in a power conversion device configured using a semiconductor power module, noise is produced by the switching operation of the semiconductor element, the potential variations in a motor driven by the power conversion device, and the like. Since such noise leads to malfunctions of various electronic devices, a noise filter is inserted so as to suppress noise.

As one of the noise suppression means described above, there is a method of utilizing, as a noise filter, a capacitance produced between a semiconductor element and a heat dissipation conductor. Since the electrode joining a semiconductor element is generally connected to a heat dissipation conductor through a thin insulator, a capacitance exists between the semiconductor element and the heat dissipation conductor. This capacitance is utilized as a filter to control the path through which a noise current flows, thereby suppressing noise.

For example, Japanese Patent Laying-Open No. 2015-149883 (PTD 1) discloses a power conversion device configured to suppress noise by utilizing a capacitance produced between a semiconductor element and a heat dissipation conductor as a proximity bypass capacitor. Furthermore, this power conversion device includes a remote bypass capacitor that is longer in current path than the proximity bypass capacitor and greater in capacitance than the proximity bypass capacitor, thereby allowing suppression of noise in a large frequency region.

CITATION LIST

Patent Literature

PTL 1: Japanese Patent Laying-Open No. 2015-149883

SUMMARY OF INVENTION

Technical Problem

In the power conversion device disclosed in the above-mentioned document, the capacitance produced between the semiconductor element and the heat dissipation conductor in the semiconductor power module is utilized as a filter, which causes a problem that noise is spread from the heat dissipation conductor. Specifically, there is a problem that a noise current flows into the heat dissipation conductor to cause generation of radiation noise from the heat dissipation conductor. Furthermore, when the heat dissipation conductor is connected to the ground, there is also a problem that a noise current propagates through the ground to a system power supply, a control circuit and the like.

The present invention has been made in light of the above-described problems. An object of the present invention is to provide a semiconductor device and a power conversion device, by which radiation noise produced from a heat dissipation conductor and a noise current diffused from the heat dissipation conductor can be suppressed.

Solution to Problem

A semiconductor device of the present invention includes a positive electrode-side semiconductor element, a negative electrode-side semiconductor element, a positive electrode plate, a negative electrode plate, an alternating-current (AC) electrode plate, a positive electrode-side auxiliary electrode terminal, a negative electrode-side auxiliary electrode terminal, a positive electrode-side capacitor, and a negative electrode-side capacitor. The positive electrode-side semiconductor element includes a first positive electrode and a first negative electrode. The negative electrode-side semiconductor element includes a second positive electrode and a second negative electrode. The positive electrode plate is connected to the first positive electrode of the positive electrode-side semiconductor element. The negative electrode plate is connected to the second negative electrode of the negative electrode-side semiconductor element. The AC electrode plate is connected to the first negative electrode of the positive electrode-side semiconductor element and the second positive electrode of the negative electrode-side semiconductor element. The positive electrode-side capacitor is connected to the positive electrode plate and the positive electrode-side auxiliary electrode terminal. The negative electrode-side capacitor is connected to the negative electrode plate and the negative electrode-side auxiliary electrode terminal.

Advantageous Effects of Invention

According to the semiconductor device of the present invention, a noise current can be controlled by: a current path formed of the first positive electrode, the positive electrode plate, the positive electrode-side capacitor, and the positive electrode-side auxiliary electrode in the positive electrode-side semiconductor element; and a current path formed of the second negative electrode, the negative electrode plate, the negative electrode-side capacitor, and the negative electrode-side auxiliary electrode in the negative electrode-side semiconductor element. Accordingly, when each of the positive electrode-side semiconductor element and the negative electrode-side semiconductor element is connected to a heat dissipation conductor through an insulator, a noise current flowing through the heat dissipation conductor can be reduced. Thus, the radiation noise produced from the heat dissipation conductor and the noise current diffused from the heat dissipation conductor can be suppressed.

DESCRIPTION OF EMBODIMENTS

The embodiments of the present invention will be hereinafter described with reference to the accompanying drawings.

First Embodiment

Figure 1:
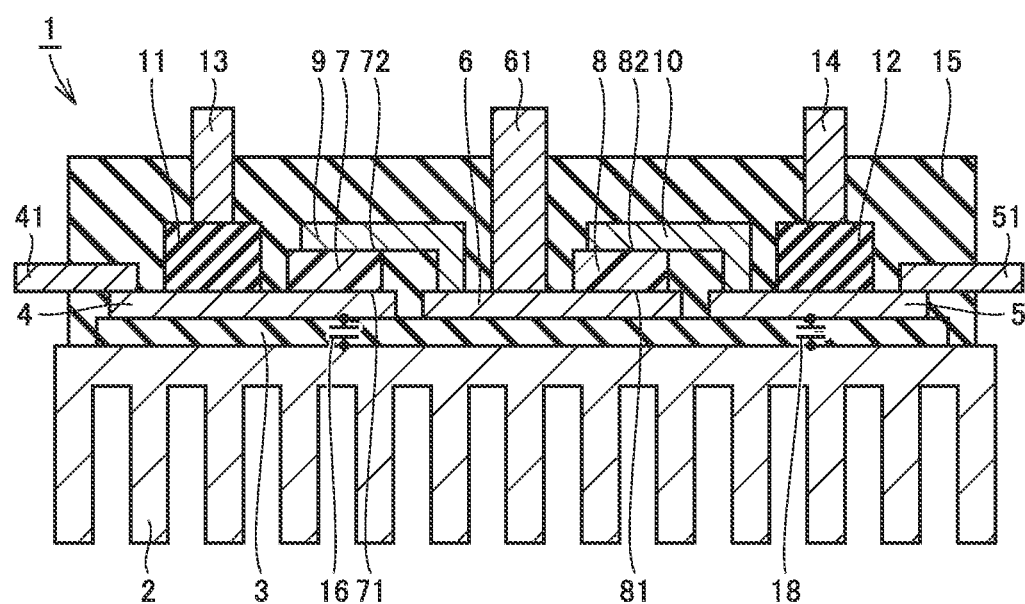
FIG. 1 is a cross-sectional view schematically showing the internal configuration of a semiconductor power module according to the first embodiment, which is taken along a line I-I in FIG. 2.
Figure 2:
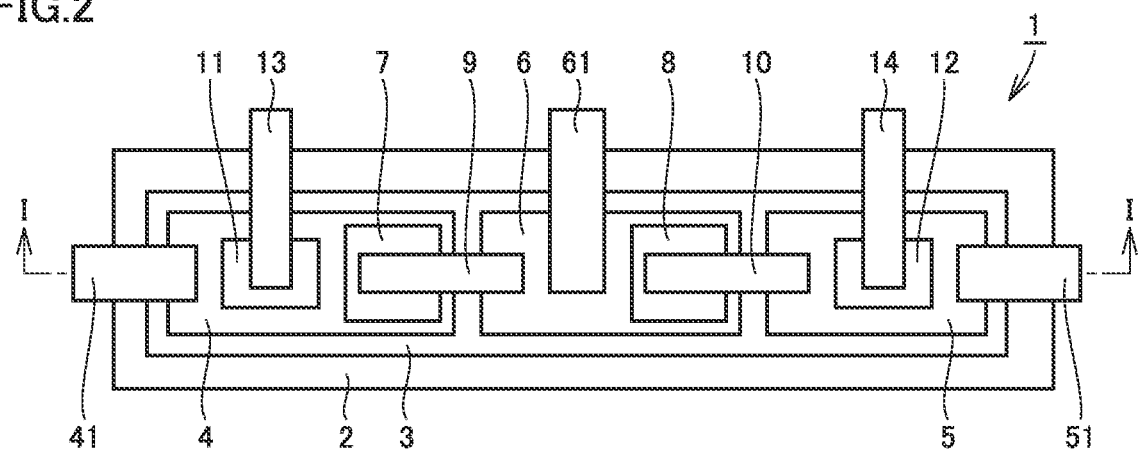
FIG. 2 is a top view schematically showing the internal configuration of the semiconductor power module according to the first embodiment.

Referring to FIGS. 1 and 2, the schematic configuration of a semiconductor power module according to the first embodiment of the present invention will be hereinafter described. In the present embodiment, as an example of the semiconductor device, a semiconductor power module including a semiconductor element for controlling electric power will be described. FIG. 1 is a cross-sectional view schematically showing the internal configuration of a semiconductor power module according to the first embodiment, which is taken along a line I-I in FIG. 2. FIG. 2 is a top view schematically showing the internal configuration of the semiconductor power module according to the first embodiment.

A semiconductor power module (semiconductor device) 1 of the present embodiment mainly includes a heat dissipation conductor 2, an insulator 3, a positive electrode plate 4, a negative electrode plate 5, an AC electrode plate 6, a positive electrode-side semiconductor element 7, a negative electrode-side semiconductor element 8, a first connection conductor 9, a second connection conductor 10, a positive electrode-side capacitor 11, a negative electrode-side capacitor 12, a positive electrode-side auxiliary electrode terminal 13, a negative electrode-side auxiliary electrode terminal 14, a sealing material 15, a positive electrode terminal 41, a negative electrode terminal 51, and an AC electrode terminal 61.

Insulator 3 is disposed on heat dissipation conductor 2, on which positive electrode plate 4, negative electrode plate 5 and AC electrode plate 6 are disposed. Insulator 3 is provided between heat dissipation conductor 2 and each of positive electrode plate 4, negative electrode plate 5 and AC electrode plate 6.

Positive electrode-side semiconductor element 7, positive electrode-side capacitor 11 and positive electrode terminal 41 are provided on positive electrode plate 4. Positive electrode-side semiconductor element 7 includes a positive electrode (the first positive electrode) 71 and a negative electrode (the first negative electrode) 72. Positive electrode plate 4 is connected to positive electrode (the first positive electrode) 71 of positive electrode-side semiconductor element 7. Negative electrode (the first negative electrode) 72 of positive electrode-side semiconductor element 7 is connected to AC electrode plate 6 through first connection conductor 9. Positive electrode-side capacitor 11 is connected to positive electrode plate 4. Positive electrode-side capacitor 11 is disposed across positive electrode plate 4 from insulator 3. Also, positive electrode-side capacitor 11 is disposed across insulator 3 from heat dissipation conductor 2. Positive electrode-side auxiliary electrode terminal 13 is provided on positive electrode-side capacitor 11. Positive electrode-side capacitor 11 is connected to positive electrode-side auxiliary electrode terminal 13. Positive electrode terminal 41 is connected to positive electrode plate 4. In the above description, positive electrode-side semiconductor element 7 is provided on positive electrode plate 4 and connected to AC electrode plate 6 through first connection conductor 9, but positive electrode-side semiconductor element 7 may be provided on AC electrode plate 6 and connected to positive electrode plate 4 through first connection conductor 9. In other words, positive electrode-side semiconductor element 7 only has to be connected to one of positive electrode plate 4 and AC electrode plate 6 through first connection conductor 9.

First connection conductor 9, negative electrode-side semiconductor element 8 and AC electrode terminal 61 are provided on AC electrode plate 6. Negative electrode-side semiconductor element 8 includes a positive electrode (the second positive electrode) 81 and a negative electrode (the second negative electrode) 82. AC electrode plate 6 is connected to positive electrode (the second positive electrode) 81 of negative electrode-side semiconductor element 8. Negative electrode (the second negative electrode) 82 of negative electrode-side semiconductor element 8 is connected to negative electrode plate 5 through second connection conductor 10. AC electrode terminal 61 is connected to AC electrode plate 6. In the above description, negative electrode-side semiconductor element 8 is provided on AC electrode plate 6 and connected to negative electrode plate 5 through second connection conductor 10, but negative electrode-side semiconductor element 8 may be provided on negative electrode plate 5 and connected to AC electrode plate 6 through second connection conductor 10. In other words, negative electrode-side semiconductor element 8 only has to be connected to one of negative electrode plate 5 and AC electrode plate 6 through second connection conductor 10.

Second connection conductor 10, negative electrode-side capacitor 12 and negative electrode terminal 51 are provided on negative electrode plate 5. Negative electrode-side capacitor 12 is connected to negative electrode plate 5.

Negative electrode-side auxiliary electrode terminal 14 is provided on negative electrode-side capacitor 12. Negative electrode-side capacitor 12 is connected to negative electrode-side auxiliary electrode terminal 14. Negative electrode-side capacitor 12 is disposed across negative electrode plate 5 from insulator 3. Also, negative electrode-side capacitor 12 is disposed across insulator 3 from heat dissipation conductor 2. Negative electrode terminal 51 is connected to negative electrode plate 5.

Insulator 3, positive electrode plate 4, negative electrode plate 5, AC electrode plate 6, positive electrode-side semiconductor element 7, negative electrode-side semiconductor element 8, first connection conductor 9, second connection conductor 10, positive electrode-side capacitor 11, and negative electrode-side capacitor 12 that are disposed on heat dissipation conductor 2 are covered with sealing material 15. Furthermore, positive electrode-side auxiliary electrode terminal 13, negative electrode-side auxiliary electrode terminal 14, positive electrode terminal 41, negative electrode terminal 51, and AC electrode terminal 61 are also covered with sealing material 15. However, a part of each of positive electrode-side auxiliary electrode terminal 13, negative electrode-side auxiliary electrode terminal 14, positive electrode terminal 41, negative electrode terminal 51, AC electrode terminal 61, positive electrode-side auxiliary electrode terminal 13, and negative electrode-side auxiliary electrode terminal 14 is exposed to the outside of sealing material 15.

It is to be noted that sealing material 15 is not shown in FIG. 2 for the purpose of showing the internal configuration of semiconductor power module 1. The same also applies to other top views. Although not shown in FIGS. 1 and 2, semiconductor power module 1 may include a case into which sealing material 15 is introduced.

Since positive electrode plate 4 and negative electrode plate 5 face heat dissipation conductor 2 with thin insulator 3 interposed therebetween, a stray capacitance 16 exists between heat dissipation conductor 2 and positive electrode plate 4 while a stray capacitance 18 exists between heat dissipation conductor 2 and negative electrode plate 5. In this case, positive electrode-side capacitor 11 is provided such that the capacitance of positive electrode-side capacitor 11 is greater than stray capacitance 16. In other words, the capacitance of positive electrode-side capacitor 11 is greater than the capacitance provided between positive electrode (the first positive electrode) 71 of positive electrode-side semiconductor element 7 and heat dissipation conductor 2 with positive electrode plate 4 interposed therebetween. Furthermore, negative electrode-side capacitor 12 is provided such that the capacitance of negative electrode-side capacitor 12 is greater than stray capacitance 18. In other words, the capacitance of negative electrode-side capacitor 12 is greater than the capacitance provided between negative electrode (the second negative electrode) 82 of negative electrode-side semiconductor element 8 and heat dissipation conductor 2 with negative electrode plate 5 interposed therebetween.

Figure 3:
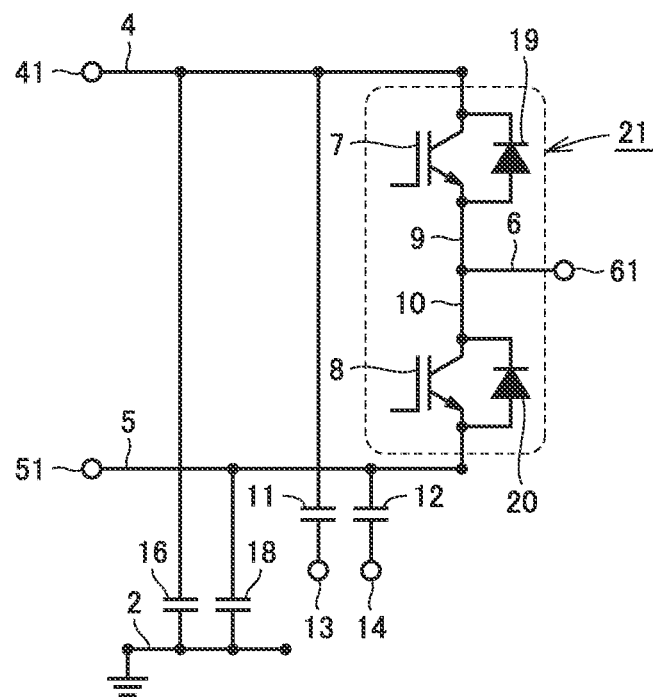
FIG. 3 is a circuit diagram schematically showing the configuration of a single-phase bridge inverter in the semiconductor power module according to the first embodiment.
Figure 4:
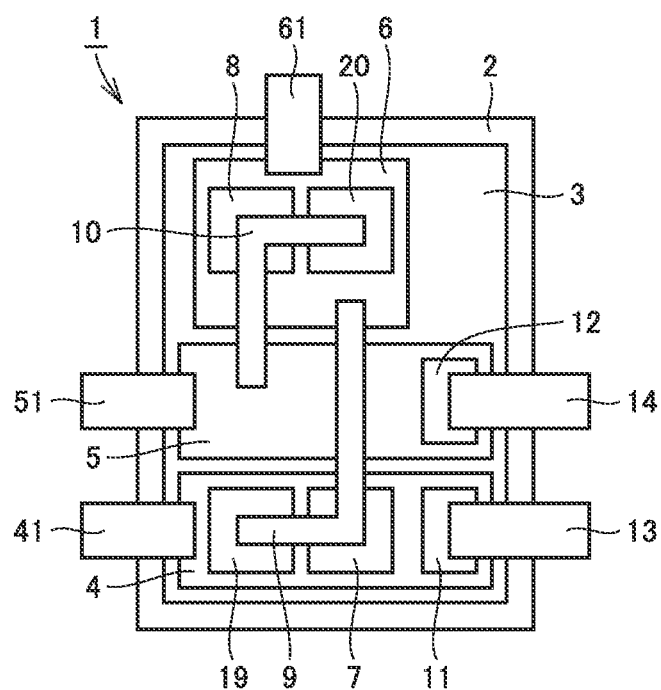
FIG. 4 is a top view schematically showing the internal configuration of the single-phase bridge inverter in the semiconductor power module according to the first embodiment.

Then, referring to FIGS. 3 and 4, an example of the specific configuration of semiconductor power module 1 according to the present embodiment will be hereinafter described. Semiconductor power module 1 shown in each of FIGS. 3 and 4 is a single-phase bridge inverter configured to have a structure shown in each of FIGS. 1 and 2. FIG. 3 is a circuit diagram schematically showing the configuration of a single-phase bridge inverter in semiconductor power module 1. FIG. 4 is a top view schematically showing the internal configuration of the single-phase bridge inverter in semiconductor power module 1.

Semiconductor power module 1 includes positive electrode-side semiconductor element 7, negative electrode-side semiconductor element 8, a positive electrode-side reflux diode 19, and a negative electrode-side reflux diode 20. Positive electrode-side semiconductor element 7 and negative electrode-side semiconductor element 8 each are, for example, an insulated gate bipolar transistor (IGBT) or a metal-oxide-semiconductor field-effect transistor (MOSFET). Positive electrode-side semiconductor element 7 is connected to positive electrode-side reflux diode 19 through first connection conductor 9. Positive electrode-side semiconductor element 7 and positive electrode-side reflux diode 19 are provided on positive electrode plate 4. Negative electrode-side semiconductor element 8 is connected to negative electrode-side reflux diode 20 through second connection conductor 10. Negative electrode-side semiconductor element 8 and negative electrode-side reflux diode 20 are provided on AC electrode plate 6.

First connection conductor 9 and second connection conductor 10 each may be made of an optional material having conductivity and formed in an optional shape. First connection conductor 9 and second connection conductor 10 each are formed, for example, of a copper lead frame, an aluminum wire, or the like. Thereby, a single-phase bridge inverter 21 is formed. Stray capacitance 16 is a parasitic capacitance that exists between positive electrode plate 4 and heat dissipation conductor 2. Stray capacitance 18 is a parasitic capacitance that exists between negative electrode plate 5 and heat dissipation conductor 2. Also, heat dissipation conductor 2 is connected to the ground.

Generally, noise is produced by the switching operation of the semiconductor element, the potential variations in the motor connected to the AC electrode terminal, and the like. A noise current flows through a current path with a small impedance. A current I and an impedance Z with respect to a capacitance C are expressed by the following equations (1) and (2), respectively.

$$I=V/Z \tag{2}$$

$$Z=1/(j\omega C)=1/(j2\pi fC) \tag{2}$$

In this case, j indicates an imaginary component, ω indicates an angular frequency, f indicates a frequency, and V indicates a voltage. Since a noise current is produced by an instantaneous switching operation and potential variations, this noise current contains a lot of high frequency components having a high frequency f. In other words, impedance Z in the equation (2) shows a low value with respect to the current containing high frequency components having frequency f. On the other hand, impedance Z shows a high value with respect to the current containing low frequency components having low frequency f. Furthermore, based on the equation (2), impedance Z shows a lower value as capacitance C is greater. Accordingly, a path having a large capacitance is provided to thereby allow formation of a path exhibiting a small impedance with respect to the noise current containing a lot of high frequency components. Thereby, the path through which a noise current flows can be set in advance, so that it becomes possible to control the current so as not to flow into a path with a low noise tolerance.

The functions and effects of the present embodiment will then be described.

According to semiconductor power module 1 of the present embodiment, the noise current can be controlled by: a current path formed of positive electrode (the first positive electrode) 71 of positive electrode-side semiconductor element 7, positive electrode plate 4, positive electrode-side capacitor 11, and positive electrode-side auxiliary electrode terminal 13; and a current path formed of negative electrode (the second negative electrode) 82 of negative electrode-side semiconductor element 8, negative electrode plate 5, negative electrode-side capacitor 12, and negative electrode-side auxiliary electrode terminal 14. Accordingly, when each of positive electrode-side semiconductor element 7 and negative electrode-side semiconductor element 8 is connected to heat dissipation conductor 2 through insulator 3, the noise current flowing through heat dissipation conductor 2 can be reduced. Therefore, it becomes possible to suppress the radiation noise generated from heat dissipation conductor 2 and the noise current diffused from heat dissipation conductor 2.

Furthermore, according to semiconductor power module 1 of the first embodiment in the present invention, positive electrode-side capacitor 11 that is greater in capacitance than stray capacitance 16 is provided on the positive electrode side. In other words, the capacitance of positive electrode-side capacitor 11 is greater than the capacitance provided between positive electrode (the first positive electrode) 71 of positive electrode-side semiconductor element 7 and heat dissipation conductor 2 with positive electrode plate 4 interposed therebetween. Thereby, it becomes possible to form a noise current path that is lower in impedance than the path of the noise current flowing through stray capacitance 16 into heat dissipation conductor 2. Furthermore, negative electrode-side capacitor 12 that is greater in capacitance than stray capacitance 18 is provided on the negative electrode side. In other words, the capacitance of negative electrode-side capacitor 12 is greater than the capacitance provided between negative electrode (the second negative electrode) 82 of negative electrode-side semiconductor element 8 and heat dissipation conductor 2 with negative electrode plate 5 interposed therebetween. Accordingly, it becomes possible to form a noise current path that is lower in impedance than the path of the noise current flowing through stray capacitance 18 into heat dissipation conductor 2. Thereby, it becomes possible to control the noise current so as not to flow through a path with a low noise tolerance. As a result, the noise current flowing through stray capacitances 16 and 18 into heat dissipation conductor 2 can be suppressed, so that it becomes possible to reduce the radiation noise generated from heat dissipation conductor 2 and the noise current propagating through heat dissipation conductor 2 to the outside.

Also, by using a capacitor, without having to change the structure of semiconductor power module 1, the capacitance of the noise current path provided on each of the positive electrode side and the negative electrode side can be readily changed to a desired value. In other words, it becomes possible to readily provide a path that is lower in impedance than the path extending through heat dissipation conductor 2 with respect to the noise current containing a lot of high frequency components.

Furthermore, in the case where the ratio of the capacitance of negative electrode-side capacitor 12 to the capacitance of positive electrode-side capacitor 11 is set at 0.9 to 1.1, the impedance can be balanced between the positive electrode side and the negative electrode side. Accordingly, the potential variations in the circuit during the operation of the inverter can be reduced. Thereby, generation of the noise by potential variations can be suppressed.

Furthermore, according to semiconductor power module 1 of the first embodiment in the present invention, positive electrode-side semiconductor element 7 is connected to one of positive electrode plate 4 and AC electrode plate 6 through first connection conductor 9. Negative electrode-side semiconductor element 8 is connected to one of negative electrode plate 5 and AC electrode plate 6 through second connection conductor 10. Thereby, electrical connection can be readily established through the connection of first connection conductor 9 and second connection conductor 10.

Second Embodiment

The same configurations as those in the above-described embodiment are designated by the same reference characters unless otherwise particularly explained, and the description thereof will not be repeated. The same also applies to the third to seventh embodiments.

Figure 5:
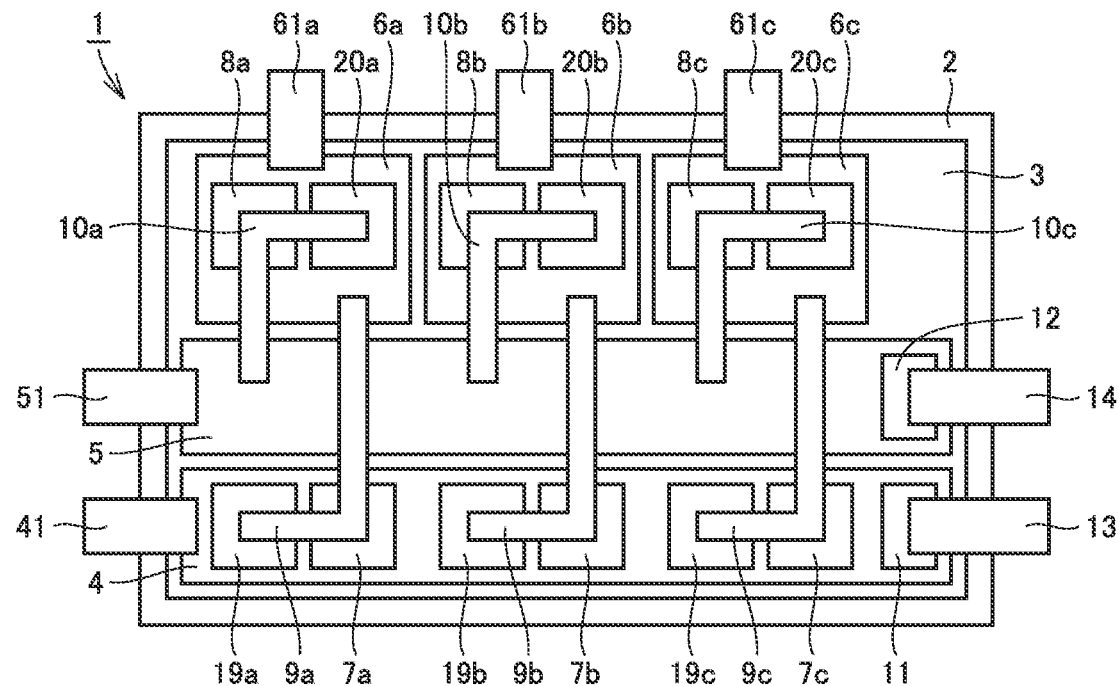
FIG. 5 is a top view schematically showing the internal configuration of a semiconductor power module according to the second embodiment.
Figure 6:
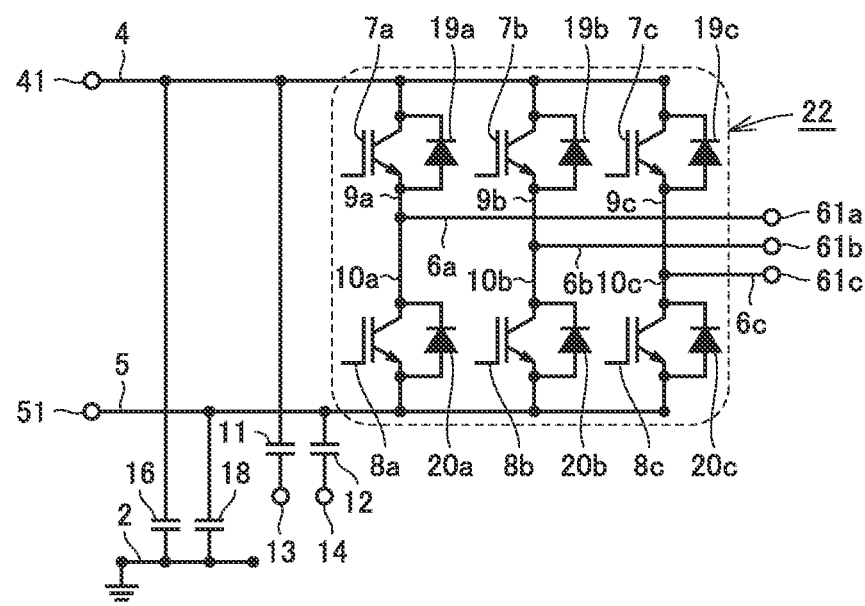
FIG. 6 is a circuit diagram schematically showing the configuration of the semiconductor power module according to the second embodiment.

Referring to FIGS. 5 and 6, a semiconductor power module 1 according to the second embodiment of the present invention will be hereinafter described. FIG. 5 is a top view schematically showing the internal configuration of semiconductor power module 1 according to the second embodiment. FIG. 6 is a circuit diagram schematically showing the configuration of semiconductor power module 1 according to the second embodiment.

Semiconductor power module 1 according to the second embodiment is a semiconductor power module including a three-phase bridge inverter 22 formed by combining three single-phase bridge inverters shown in the first embodiment.

Semiconductor power module 1 of the present embodiment includes: AC electrode plates 6a, 6b, and 6c; positive electrode-side semiconductor elements 7a, 7b, and 7c; negative electrode-side semiconductor elements 8a, 8b, and 8c; first connection conductors 9a, 9b, and 9c; second connection conductors 10a, 10b, and 10c; and AC electrode terminals 61a, 61b, and 61c.

Positive electrode-side semiconductor elements 7a, 7b, and 7c and positive electrode-side reflux diodes 19a, 19b, and 19c are provided on positive electrode plate 4. Positive electrode-side reflux diodes 19a, 19b, and 19c are connected in parallel with positive electrode-side semiconductor elements 7a, 7b, and 7c through first connection conductors 9a, 9b, and 9c, respectively.

Negative electrode-side semiconductor element 8a, negative electrode-side reflux diode 20a and AC electrode terminal 61a are provided on AC electrode plate 6a. Negative electrode-side semiconductor element 8b, negative electrode-side reflux diode 20b and AC electrode terminal 61b are provided on AC electrode plate 6b. Negative electrode-side semiconductor element 8c, negative electrode-side reflux diode 20c and AC electrode terminal 61c are provided on AC electrode plate 6c. Negative electrode-side reflux diodes 20a, 20b and 20c are connected in parallel with negative electrode-side semiconductor elements 8a, 8b, and 8c through second connection conductors 10a, 10b, and 10c, respectively.

In this way, semiconductor power module 1 according to the second embodiment is similar in basic configuration to semiconductor power module 1 according to the first embodiment, but is different from semiconductor power module 1 according to the first embodiment in that three-phase bridge inverter 22 is formed inside a single module and that positive electrode-side capacitor 11 and negative electrode-side capacitor 12 that are disposed in each phase are shared in common.

According to semiconductor power module 1 of the second embodiment, the path through which a noise current flows can be set in advance, so that the current can be controlled so as not to flow through the path having a low noise tolerance. Furthermore, three-phase bridge inverter 22 is formed inside a single module, and positive electrode-side capacitor 11 and negative electrode-side capacitor 12 are shared in common, so that the module can be reduced in size.

Third Embodiment

Figure 7:
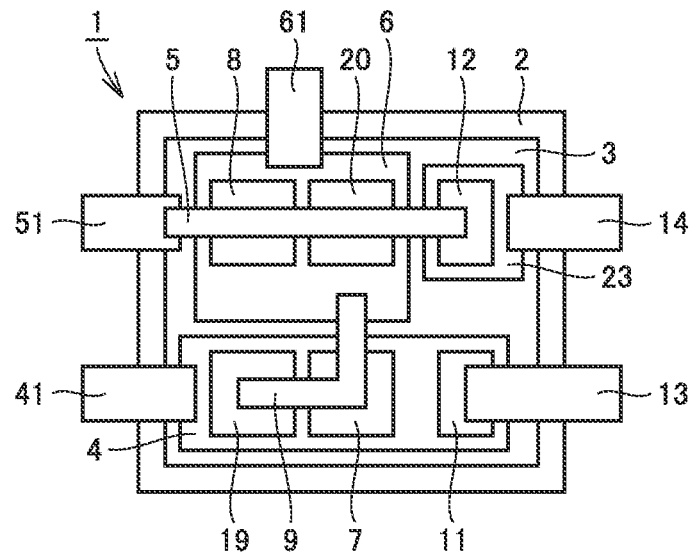
FIG. 7 is a top view schematically showing the internal configuration of a single-phase bridge inverter in a semiconductor power module according to the third embodiment.
Figure 8:
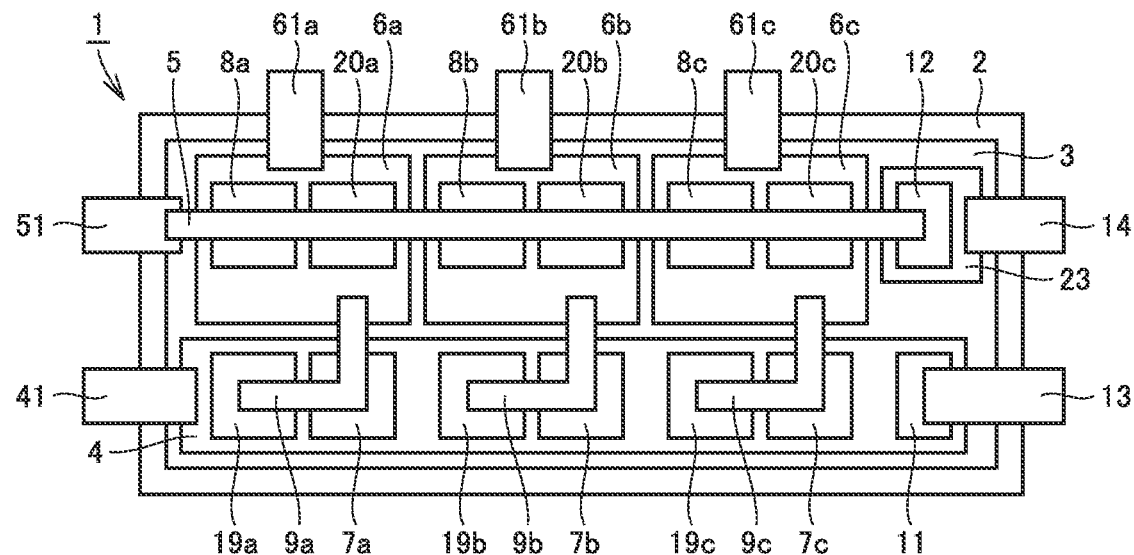
FIG. 8 is a top view schematically showing the internal configuration of a three-phase bridge inverter in the semiconductor power module according to the third embodiment.

Then, referring to FIGS. 7 and 8, a semiconductor power module 1 according to the third embodiment will be hereinafter described. FIG. 7 is a top view schematically showing the internal configuration of a single-phase bridge inverter in semiconductor power module 1 according to the third embodiment. FIG. 8 is a top view schematically showing the internal configuration of a three-phase bridge inverter in semiconductor power module 1 according to the third embodiment.

Semiconductor power module 1 according to the third embodiment shown in FIG. 7 is different from semiconductor power module 1 according to the first embodiment or the second embodiment mainly in that negative electrode plate 5 is disposed on negative electrode-side semiconductor element 8 and negative electrode-side reflux diode 20.

Semiconductor power module 1 according to the third embodiment further includes an auxiliary electrode plate 23. Auxiliary electrode plate 23 is provided on insulator 3. Negative electrode-side auxiliary electrode terminal 14 is connected to auxiliary electrode plate 23. Negative electrode-side capacitor 12 is disposed on auxiliary electrode plate 23. Negative electrode plate 5 is disposed on negative electrode-side capacitor 12. Negative electrode plate 5 is disposed on negative electrode-side reflux diode 20. Negative electrode plate 5 is disposed on negative electrode-side semiconductor element 8. Negative electrode-side semiconductor element 8 is connected to negative electrode-side reflux diode 20 through negative electrode plate 5. Negative electrode plate 5 is provided on negative electrode terminal 51.

Semiconductor power module 1 according to the third embodiment shown in FIG. 8 is a semiconductor power module including a three-phase bridge inverter formed by combining three single-phase bridge inverters shown in FIG. 7.

In semiconductor power module 1 according to the third embodiment shown in FIG. 8, negative electrode plate 5 is disposed on negative electrode-side semiconductor elements 8*a*, 8*b* and 8*c*. Negative electrode plate 5 is disposed on negative electrode-side reflux diodes 20*a*, 20*b* and 20*c*. Negative electrode-side semiconductor elements 8*a*, 8*b*, and 8*c* are connected to negative electrode-side reflux diodes 20*a*, 20*b*, and 20*c*, respectively, through negative electrode plate 5.

According to semiconductor power module 1 of the third embodiment, negative electrode plate 5 is disposed on negative electrode-side semiconductor element 8 (8*a*, 8*b*, 8*c*) and negative electrode-side capacitor 12. Thus, negative electrode plate 5 is provided on a plane different from positive electrode plate 4 and AC electrode plate 6, so that semiconductor power module 1 can be further reduced in size.

Fourth Embodiment

Figure 9:
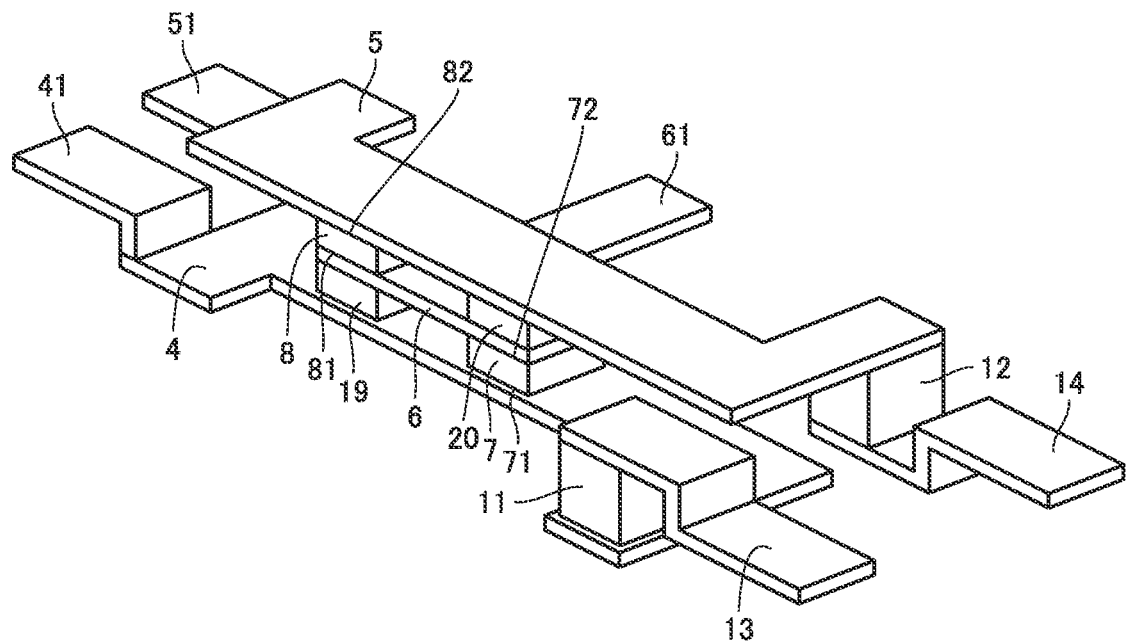
FIG. 9 is a perspective view schematically showing the internal configuration of a semiconductor power module according to the fourth embodiment.

Then, referring to FIG. 9, a semiconductor power module 1 according to the fourth embodiment will be hereinafter described. FIG. 9 is a perspective view schematically showing a part of the internal configuration of semiconductor power module 1 according to the fourth embodiment. FIG. 9 does not show heat dissipation conductor 2, insulator 3 and sealing material 15 for the sake of explanation.

Positive electrode-side semiconductor element 7 and positive electrode-side reflux diode 19 are disposed on positive electrode plate 4. Positive electrode (the first positive electrode) 71 of positive electrode-side semiconductor element 7 and the negative electrode of positive electrode-side reflux diode 19 are connected to positive electrode plate 4.

AC electrode plate 6 is disposed on positive electrode-side semiconductor element 7 and positive electrode-side reflux diode 19. Negative electrode-side semiconductor element 8 and negative electrode-side reflux diode 20 are disposed on AC electrode plate 6. Negative electrode (the first negative electrode) 72 of positive electrode-side semiconductor element 7 and the positive electrode of positive electrode-side reflux diode 19 are connected to positive electrode (the second positive electrode) 81 of negative electrode-side semiconductor element 8 and the negative electrode of negative electrode-side reflux diode 20 through AC electrode plate 6.

Negative electrode plate 5 is disposed on negative electrode-side semiconductor element 8 and negative electrode-side reflux diode 20. Negative electrode (the second negative electrode) 82 of negative electrode-side semiconductor element 8 and the positive electrode of negative electrode-side reflux diode 20 are connected to negative electrode plate 5.

Positive electrode-side capacitor 11 is provided on positive electrode plate 4. Positive electrode-side auxiliary electrode terminal 13 is connected onto positive electrode-side capacitor 11. Furthermore, negative electrode-side capacitor 12 is provided on negative electrode-side auxiliary electrode terminal 14. Negative electrode plate 5 is connected onto negative electrode-side capacitor 12.

According to the semiconductor power module of the fourth embodiment, positive electrode-side semiconductor element 7 and negative electrode-side semiconductor element 8 are arranged in a three-dimensional structure. Therefore, it becomes possible to implement a semiconductor element having a high density as compared with the conventional semiconductor power module in which positive electrode-side semiconductor element 7 and negative electrode-side semiconductor element 8 are arranged in the same plane, so that the semiconductor power module can be further reduced in size.

Furthermore, according to the semiconductor power module of the fourth embodiment, positive electrode-side reflux diode 19 and negative electrode-side reflux diode 20 are arranged in a three-dimensional structure. Therefore, it becomes possible to implement a semiconductor element having a high density as compared with the conventional semiconductor power module in which positive electrode-side reflux diode 19 and negative electrode-side reflux diode 20 are arranged in the same plane, so that the semiconductor power module can be further reduced in size.

Fifth Embodiment

Figure 10:
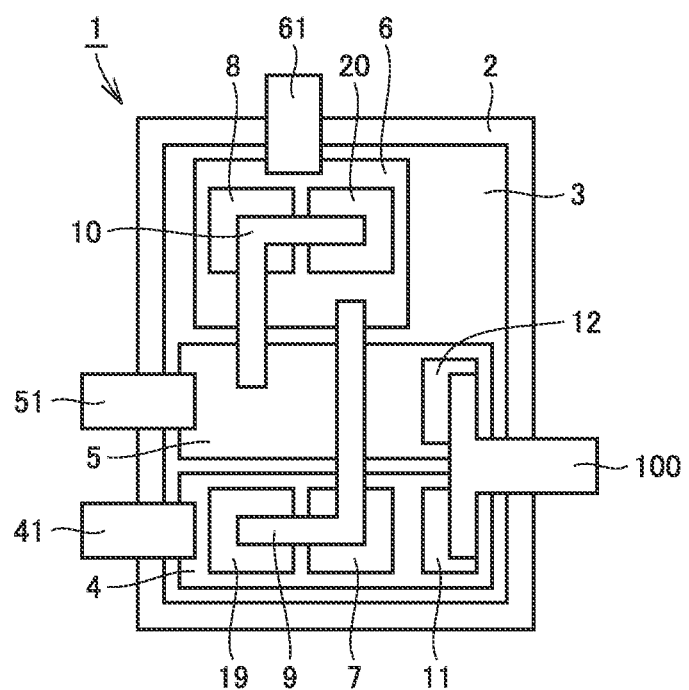
FIG. 10 is a top view schematically showing the internal configuration of an example of a semiconductor power module according to the fifth embodiment.
Figure 11:
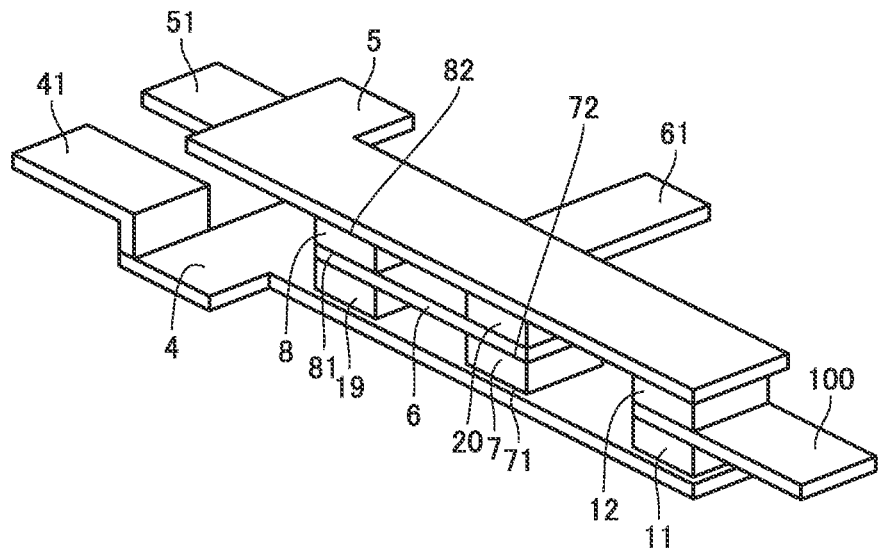
FIG. 11 is a perspective view schematically showing the internal configuration of another example of the semiconductor power module according to the fifth embodiment.

Then, a semiconductor power module 1 according to the fifth embodiment will be hereinafter described with reference to FIGS. 10 and 11. FIG. 10 is a top view schematically showing the internal configuration of an example of semiconductor power module 1 according to the fifth embodiment. FIG. 10 corresponds to FIG. 4. FIG. 11 is a perspective view schematically showing the internal configuration of another example of the semiconductor power module according to the fifth embodiment. FIG. 11 also corresponds to FIG. 9.

Semiconductor power module 1 according to the fifth embodiment is different from semiconductor power module 1 according to each of the first to fourth embodiments in that a common auxiliary electrode terminal 100 is connected to positive electrode-side capacitor 11 and negative electrode-side capacitor 12.

In semiconductor power module 1 according to the fifth embodiment, positive electrode-side auxiliary electrode terminal 13 and negative electrode-side auxiliary electrode terminal 14 are integrated with each other to form common auxiliary electrode terminal 100. As positive electrode-side auxiliary electrode terminal 13 connected to positive electrode-side capacitor 11 and negative electrode-side auxiliary electrode terminal 14 connected to negative electrode-side capacitor 12, common auxiliary electrode terminal 100 is connected to positive electrode-side capacitor 11 and negative electrode-side capacitor 12.

According to semiconductor power module 1 of the fifth embodiment, common auxiliary electrode terminal 100 is connected to positive electrode-side capacitor 11 and negative electrode-side capacitor 12, so that the structure can be simplified and reduced in size.

Sixth Embodiment

Figure 12:
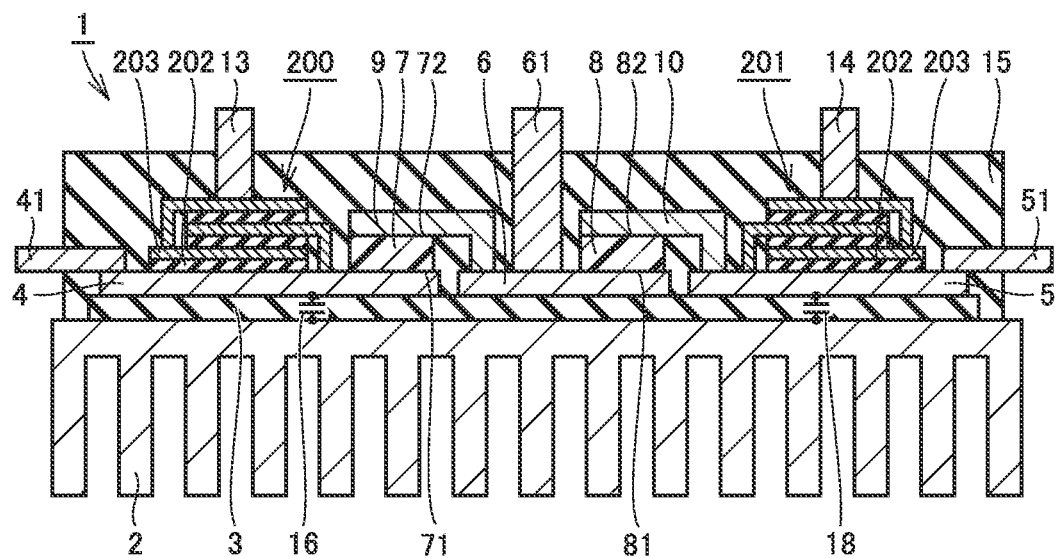
FIG. 12 is a cross-sectional view schematically showing the internal configuration of a semiconductor power module according to the sixth embodiment.
Figure 13:
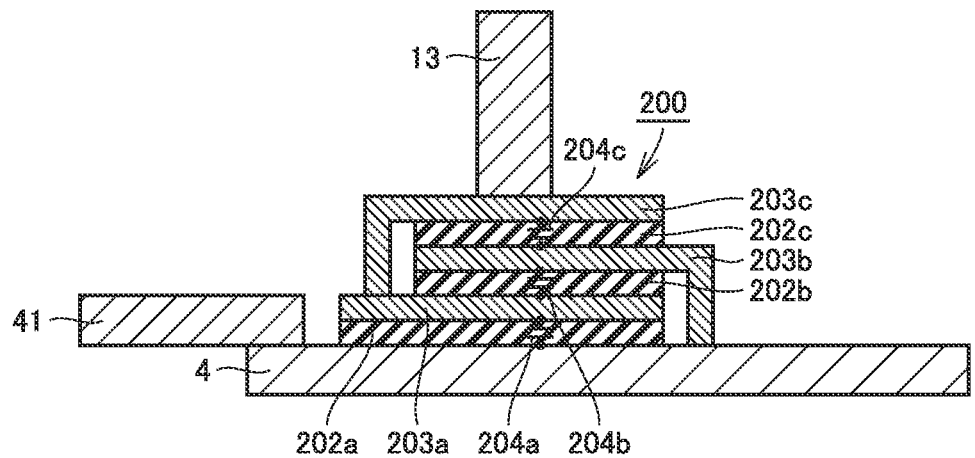
FIG. 13 is a schematic cross-sectional view schematically showing the configuration of a stacked conductor pattern according to the sixth embodiment.

Then, referring to FIGS. 12 and 13, a semiconductor power module 1 according to the sixth embodiment will be hereinafter described. FIG. 12 is a cross-sectional view schematically showing the internal configuration of semiconductor power module 1 according to the sixth embodiment. FIG. 13 is a schematic cross-sectional view schematically showing the configuration of a stacked conductor pattern according to the sixth embodiment.

Semiconductor power module 1 according to the sixth embodiment is different from semiconductor power module 1 according to each of the first to fifth embodiments in that stacked conductor patterns 200 and 201 are provided as positive electrode-side capacitor 11 and negative electrode-side capacitor 12, respectively. In the present embodiment, each of positive electrode-side capacitor 11 and negative electrode-side capacitor 12 includes a conductor 203 and an insulator 202. Positive electrode-side capacitor 11 is formed by sandwiching insulator 202 between positive electrode plate 4 and conductor 203 while negative electrode-side capacitor 12 is formed by sandwiching insulator 202 between negative electrode plate 5 and conductor 203.

As shown in FIG. 12, stacked conductor patterns 200 and 201 each has a configuration in which insulator 202 and conductor 203 are alternately stacked. The number of stacks of insulator 202 and conductor 203 may be one, or may be two or more. The following is an explanation with reference to an example of the case where the number of stacks is more than one. Each of positive electrode-side capacitor 11 and negative electrode-side capacitor 12 includes a plurality of conductors 203 and a plurality of insulators 202 that are equal in number to the plurality of conductors 203. Insulators 202 and conductors 203 are stacked alternately one by one sequentially in a single column on each of positive electrode plate 4 and negative electrode plate 5. Among conductors 203 stacked on positive electrode plate 4, a conductor 203 in an odd-numbered layer counted from positive electrode plate 4 is connected to positive electrode-side auxiliary electrode terminal 13 and a conductor 203 in an even-numbered layer counted from positive electrode plate 4 is connected to positive electrode plate 4. Among conductors 203 stacked on negative electrode plate 5, a conductor 203 in an odd-numbered layer counted from negative electrode plate 5 is connected to negative electrode-side auxiliary electrode terminal 14 and a conductor 203 in an even-numbered layer counted from negative electrode plate 5 is connected to negative electrode plate 5.

Referring to FIG. 13, the configuration of stacked conductor pattern 200 will be hereinafter specifically described. For example, when three layers are stacked, stacked conductor pattern 200 includes a first insulator 202a, a second insulator 202b, a third insulator 202c, a first conductor 203a, a second conductor 203b, and a third conductor 203c.

First insulator 202a, second insulator 202b and third insulator 202c; and first conductor 203a, second conductor 203b and third conductor 203c are alternately stacked in a single column specifically such that first insulator 202a, first conductor 203a, second insulator 202b, second conductor 203b, third insulator 202c, and third conductor 203c are stacked in this order. First insulator 202a is sandwiched between positive electrode plate 4 and first conductor 203a. Second insulator 202b is sandwiched between first conductor 203a and second conductor 203b. Third insulator 202c is sandwiched between second conductor 203b and third conductor 203c. First conductor 203a is connected to third conductor 203c. Second conductor 203b is connected to positive electrode plate 4. Third conductor 203c is connected to positive electrode-side auxiliary electrode terminal 13.

In this way, when first conductor 203a, second conductor 203b and third conductor 203c that are stacked are connected in every layer, capacitances 204a, 204b and 204c produced between conductors are connected in parallel with one another. Thus, the capacitance produced between positive electrode plate 4 and positive electrode-side auxiliary electrode terminal 13 can be increased in capacity.

Stacked conductor pattern 201 also has the same configuration. Stacked conductor pattern 201 is different from stacked conductor pattern 200 in that: first insulator 202a is sandwiched between negative electrode plate 5 and first conductor 203a; second conductor 203b is connected to negative electrode plate 5; and third conductor 203c is connected to negative electrode-side auxiliary electrode terminal 14. In stacked conductor pattern 201, the capacitance produced between negative electrode plate 5 and negative electrode-side auxiliary electrode terminal 14 can be increased in capacity.

The capacitance of stacked conductor pattern 200 connected to the positive electrode side is represented as $\varepsilon S/d$ using: facing areas S between positive electrode plate 4 and first conductor 203a, between first conductor 203a and second conductor 203b, between second conductor 203b and third conductor 203c; and a thickness d and a dielectric constant $\varepsilon$ of first insulator 202a, second insulator 202b and third insulator 202c. On the other hand, stray capacitance 16 on the positive electrode side is represented as $\varepsilon'S'/d'$ using: a facing area S' between positive electrode plate 4 and heat dissipation conductor 2; and a thickness d' and a dielectric constant $\varepsilon'$ of insulator 3. Accordingly, when the ratio of $\varepsilon S/d$ to $\varepsilon'S'/d'$ is set to be greater than 1, the same effect as that of semiconductor power module 1 according to each of the first to fifth embodiments can be obtained. In order to increase capacitance $\varepsilon S/d$ of the stacked conductor pattern, for example, the area of conductor 203 may be increased, the number of stacks of conductors 203 may be increased, the thickness of insulator 202 may be reduced, the dielectric constant of insulator 202 may be increased, and the like. This also applies to stacked conductor pattern 201 on the negative electrode side.

According to semiconductor power module 1 of the sixth embodiment, stacked conductor pattern 200 and stacked conductor pattern 201 are provided as positive electrode-side capacitor 11 and negative electrode-side capacitor 12, respectively. Accordingly, by using stacked conductor patterns 200 and 201, without having to use a capacitor, the capacitance larger in capacity than stray capacitances 16 and 18 can be implemented.

According to power module 1 of the present embodiment, positive electrode-side capacitor 11 is formed by sandwiching insulator 202 between positive electrode plate 4 and conductor 203 while negative electrode-side capacitor 12 is formed by sandwiching insulator 202 between negative electrode plate 5 and conductor 203. Accordingly, a capacitance with large capacity can be implemented by stacking conductor 203 and insulator 202.

Furthermore, according to power module 1 of the present embodiment, each of positive electrode-side capacitor 11 and negative electrode-side capacitor 12 includes a plurality of conductors 203 and a plurality of insulators 202 that are equal in number to the plurality of conductors 203. Among conductors 203 stacked on positive electrode plate 4, a conductor 203 in an odd-numbered layer counted from positive electrode plate 4 is connected to positive electrode-side auxiliary electrode terminal 13 and a conductor 203 in an even-numbered layer counted from positive electrode plate 4 is connected to positive electrode plate 4. Also, among conductors 203 stacked on negative electrode plate 5, a conductor 203 in an odd-numbered layer counted from negative electrode plate 5 is connected to negative electrode-side auxiliary electrode terminal 14 and a conductor 203 in an even-numbered layer counted from negative electrode plate 5 is connected to negative electrode plate 5. Thus, a capacitance with large capacity can be implemented by stacking a plurality of conductors 203 and a plurality of insulators 202.

Seventh Embodiment

Figure 14:
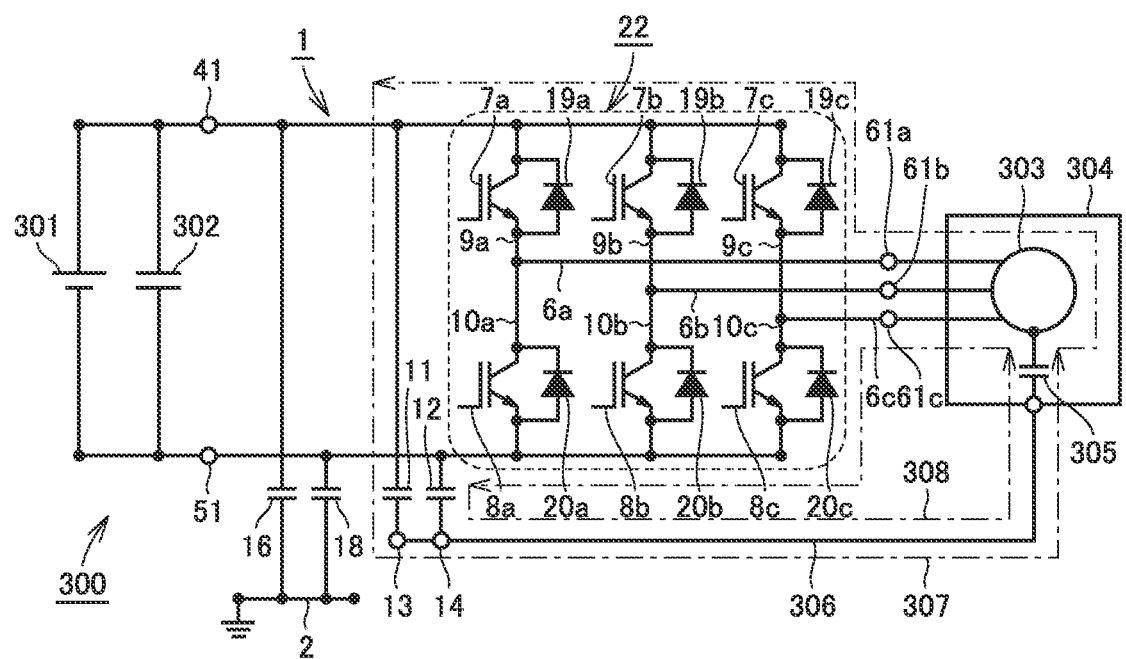
FIG. 14 is a circuit diagram schematically showing the configuration of a power conversion device according to the seventh embodiment.
Figure 15:
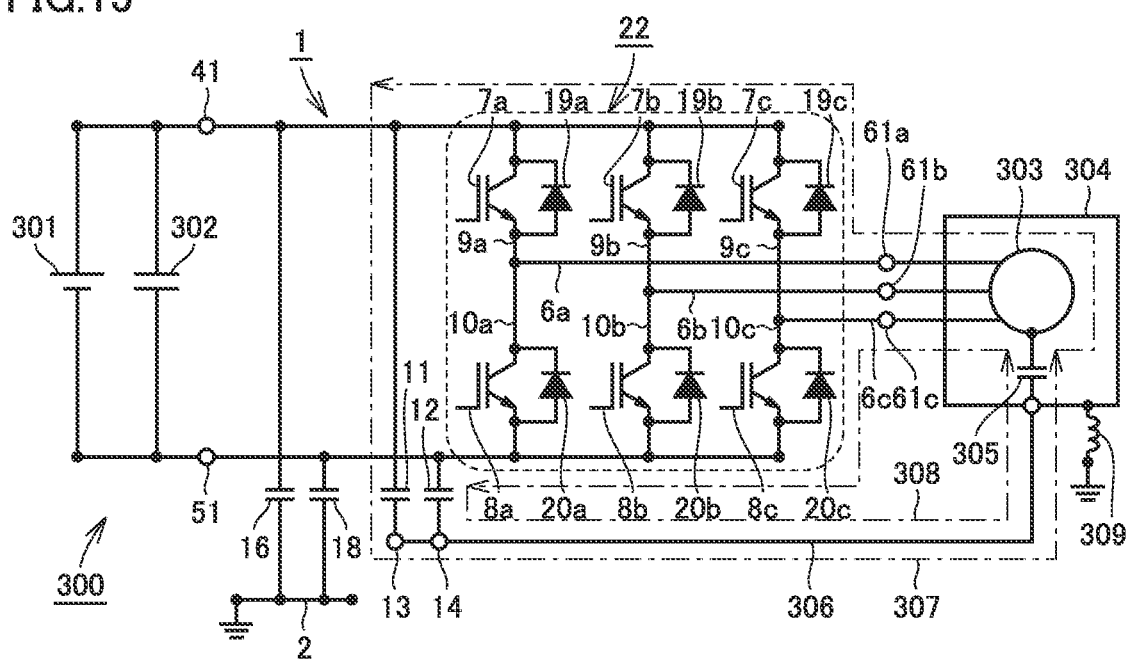
FIG. 15 is a circuit diagram schematically showing the configuration of a modification of the power conversion device according to the seventh embodiment.

Then, referring to FIGS. 14 and 15, a power conversion device 300 according to the seventh embodiment will be hereinafter described. FIG. 14 is a circuit diagram schematically showing the configuration of power conversion device 300 according to the seventh embodiment. FIG. 15 is a circuit diagram schematically showing the configuration of a modification of the power conversion device according to the seventh embodiment.

Power conversion device 300 includes a semiconductor power module 1. A DC power supply 301 and a smoothing capacitor 302 are connected in parallel with positive electrode terminal 41 and negative electrode terminal 51 of semiconductor power module 1. AC electrode terminals 61a, 61b and 61c are connected to a motor (load) 303. Heat dissipation conductor 2 is connected to the ground. In this case, the ground is defined as a reference potential of the power conversion device, and provided as a metal housing and the like of power conversion device 300, for example. Motor 303 is housed in a motor-accommodating metal housing (a load-accommodating metal housing) 304. Also, motor-accommodating metal housing 304 is connected to positive electrode-side auxiliary electrode terminal 13 and negative electrode-side auxiliary electrode terminal 14 of semiconductor power module 1 through a connection line 306. A stray capacitance 305 exists between motor 303 and motor-accommodating metal housing 304. Thus, a current path 307 and a current path 308 each are formed by three-phase bridge inverter 22, positive electrode-side capacitor 11 or negative electrode-side capacitor 12, connection line 306, stray capacitance 305, and motor 303.

According to semiconductor power module 1 of the seventh embodiment, positive electrode-side auxiliary electrode terminal 13 and negative electrode-side auxiliary electrode terminal 14 are connected to motor-accommodating metal housing 304. Also, the capacitance by positive electrode-side capacitor 11 and the capacitance by negative electrode-side capacitor 12 are greater than stray capacitance 16 and stray capacitance 18, respectively. Accordingly, current path 307 and current path 308 are low in impedance with respect to the noise current containing a high frequency component. Thus, the noise current can be controlled. Therefore, the noise current flowing through heat dissipation conductor 2 can be suppressed. Consequently, it becomes possible to reduce the noise current propagating through heat dissipation conductor 2 and the radiation noise generated from heat dissipation conductor 2.

Furthermore, as shown in FIG. 15, motor-accommodating metal housing 304 may be connected to the ground through an inductor 309. In the modification of the power conversion device according to the seventh embodiment, motor-accommodating metal housing 304 is connected to the ground through inductor 309.

Inductor 309 shows a high impedance with respect to the noise current containing a lot of high frequency components as represented in the following equation (3). In this case, L indicates an inductance.

$$Z = j\omega L = j2\pi f L \qquad (3)$$

In the modification of the power conversion device according to the seventh embodiment, motor-accommodating metal housing 304 is connected to the ground through inductor 309. Accordingly, the electric potential of motor-accommodating metal housing 304 can be stabilized at the electric potential of the ground, and the noise current flowing through the ground can be suppressed. Therefore, the noise propagating from the ground can be suppressed.

Semiconductor power module 1 according to each of the first to seventh embodiments has a configuration in which positive electrode-side capacitor 11 and negative electrode-side capacitor 12 or stacked conductor patterns 200 and 201 are incorporated by sealing material 15, but may be connected to positive electrode terminal 41 and negative electrode terminal 51 on the outside of sealing material 15. In this case, positive electrode-side auxiliary electrode terminal 13, negative electrode-side auxiliary electrode terminal 14 or common auxiliary electrode terminal 100 may be entirely exposed.

In addition, the members forming semiconductor power module 1 according to each of the first to seventh embodiments only have to be connected by any method but may be connected, for example, by solder, an adhesive and the like.

The above-described embodiments can be combined as appropriate.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST 1 semiconductor power module, 2 heat dissipation conductor, 3 insulator, 4 positive electrode plate, 5 negative electrode plate, 6 AC electrode plate, 7 positive electrode-side semiconductor element, 8 negative electrode-side semiconductor element, 9 first connection conductor, 10 second connection conductor, 11 positive electrode-side capacitor, 12 negative electrode-side capacitor, 13 positive electrode-side auxiliary electrode terminal, 14 negative electrode-side auxiliary electrode terminal, 15 sealing material, 16, 18 stray capacitance, 19 positive electrode-side reflux diode, 20 negative electrode-side reflux diode, 21 single-phase bridge inverter, 22 three-phase bridge inverter, 23 auxiliary electrode plate, 41 positive electrode terminal, 51 negative electrode terminal, 61 AC electrode terminal, 71 first positive electrode, 72 first negative electrode, 81 second positive electrode, 82 second negative electrode, 100 common auxiliary electrode terminal, 200, 201 stacked conductor pattern, 202a first insulator, 202b second insulator, 202c third insulator, 203a first conductor, 203b second conductor, 203c third conductor, 300 power conversion device, 301 DC power supply, 302 smoothing capacitor, 303 motor, 304 motor-accommodating metal housing, 306 connection line, 307, 308 current path, 309 inductor.

The invention claimed is:

1. A semiconductor device comprising:
   a positive electrode-side semiconductor element including a first positive electrode and a first negative electrode;
   a negative electrode-side semiconductor element including a second positive electrode and a second negative electrode;
   a positive electrode plate connected to the first positive electrode of the positive electrode-side semiconductor element;
   a negative electrode plate connected to the second negative electrode of the negative electrode-side semiconductor element;
   an AC electrode plate connected to the first negative electrode of the positive electrode-side semiconductor element and the second positive electrode of the negative electrode-side semiconductor element;
   a positive electrode-side auxiliary electrode terminal;
   a negative electrode-side auxiliary electrode terminal;
   a positive electrode-side capacitor connected to the positive electrode plate and the positive electrode-side auxiliary electrode terminal;
   a negative electrode-side capacitor connected to the negative electrode plate and the negative electrode-side auxiliary electrode terminal;
   a heat dissipation conductor; and
   an insulator provided between the heat dissipation conductor and each of the positive electrode plate, the negative electrode plate and the AC electrode plate, wherein
   a capacitance of the positive electrode-side capacitor is greater than a capacitance provided between the first positive electrode of the positive electrode-side semiconductor element and the heat dissipation conductor with the positive electrode plate interposed therebetween, and
   a capacitance of the negative electrode-side capacitor is greater than a capacitance provided between the second negative electrode of the negative electrode-side semiconductor element and the heat dissipation conductor with the negative electrode plate interposed therebetween.

2. The semiconductor device according to claim 1, further comprising an auxiliary electrode plate provided on the insulator, wherein the negative electrode-side auxiliary electrode terminal is connected to the auxiliary electrode plate,
the negative electrode-side capacitor is disposed on the auxiliary electrode plate, and
the negative electrode plate is disposed on the negative electrode-side semiconductor element and the negative electrode-side capacitor.

3. The semiconductor device according to claim 1, wherein
the AC electrode plate is disposed on the positive electrode-side semiconductor element,
the negative electrode-side semiconductor element is disposed on the AC electrode plate, and
the negative electrode plate is disposed on the negative electrode-side semiconductor element.

4. The semiconductor device according to claim 1, wherein
the positive electrode-side auxiliary electrode terminal and the negative electrode-side auxiliary electrode terminal are integrated with each other to form a common auxiliary electrode terminal.

5. The semiconductor device according to claim 1, wherein
each of the positive electrode-side capacitor and the negative electrode-side capacitor includes
a conductor, and
an insulator,
the positive electrode-side capacitor is formed by sandwiching the insulator of the positive electrode-side capacitor between the positive electrode plate and the conductor, and
the negative electrode-side capacitor is formed by sandwiching the insulator of the negative electrode-side capacitor between the negative electrode plate and the conductor.

6. The semiconductor device according to claim 1, wherein
each of the positive electrode-side capacitor and the negative electrode-side capacitor includes
a plurality of conductors, and
a plurality of insulators that are equal in number to the plurality of conductors,
the plurality of insulators and the plurality of conductors are stacked alternately one by one sequentially in a single column on each of the positive electrode plate and the negative electrode plate,
a first conductor of the plurality of conductors stacked on the positive electrode plate in an odd-numbered layer counted from the positive electrode plate is connected to the positive electrode-side auxiliary electrode terminal, and a second conductor of the plurality of conductors stacked on the positive electrode plate in an even-numbered layer counted from the positive electrode plate is connected to the positive electrode plate, and
a third conductor of the plurality of conductors stacked on the negative electrode plate in an odd-numbered layer counted from the negative electrode plate is connected to the negative electrode-side auxiliary electrode terminal, and a fourth conductor of the plurality of conductors stacked on the negative electrode plate in an even-numbered layer counted from the negative electrode plate is connected to the negative electrode plate.

7. The semiconductor device according to claim 1, wherein the positive electrode-side semiconductor element is connected to one of the positive electrode plate and the AC electrode plate through a first connection conductor, and the negative electrode-side semiconductor element is connected to one of the negative electrode plate and the AC electrode plate through a second connection conductor.

8. A power conversion device comprising:

the semiconductor device according to claim 1;

a load; and a load-accommodating metal housing in which the load is accommodated, the positive electrode-side auxiliary electrode terminal and the negative electrode-side auxiliary electrode terminal being connected to the load-accommodating metal housing.

9. The power conversion device according to claim 8, further comprising an inductor, wherein the load-accommodating metal housing is connected to a ground through the inductor.

* * * * *